United States Patent
Zhang et al.

(10) Patent No.: US 10,399,319 B2
(45) Date of Patent: Sep. 3, 2019

(54) DOUBLE-SIDED ADHESIVE ATTACHING DEVICE AND METHOD FOR ATTACHMENT OF THE DOUBLE-SIDED ADHESIVE

(71) Applicants: BOE Technology Group Co., Ltd., Beijing (CN); Hefei Xinsheng Optoelectronics Technology Co., Ltd., Hefei (CN)

(72) Inventors: Shancai Zhang, Beijing (CN); Chengcheng Hou, Beijing (CN); Yueyuan Zhang, Beijing (CN); Hengbin Li, Beijing (CN); Ming Hu, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 223 days.

(21) Appl. No.: 15/312,279

(22) PCT Filed: Jan. 28, 2016

(86) PCT No.: PCT/CN2016/072417
§ 371 (c)(1),
(2) Date: Nov. 18, 2016

(87) PCT Pub. No.: WO2017/045332
PCT Pub. Date: Mar. 23, 2017

(65) Prior Publication Data
US 2017/0259548 A1    Sep. 14, 2017

(30) Foreign Application Priority Data

Sep. 16, 2015 (CN) .......................... 2015 1 0591922

(51) Int. Cl.
*B32B 38/10* (2006.01)
*B25J 9/00* (2006.01)
(Continued)

(52) U.S. Cl.
CPC ............. *B32B 38/10* (2013.01); *B25J 9/0096* (2013.01); *B32B 37/10* (2013.01); *B32B 37/12* (2013.01);
(Continued)

(58) Field of Classification Search
CPC ....... B32B 38/10; B32B 43/006; B32B 37/12; Y10T 156/1195; Y10T 156/1994;
(Continued)

(56) References Cited

U.S. PATENT DOCUMENTS 6,070,322 A    6/2000    Case et al.
6,503,130 B2 *  1/2003    Lim ....................... B24B 37/34
                                                                        156/716
(Continued)

FOREIGN PATENT DOCUMENTS

CN    201608978 U    10/2010
CN    102241180 A *  11/2011
(Continued)

OTHER PUBLICATIONS

Machine translation of CN 102241180 date unknown.*
(Continued)

*Primary Examiner* — John L Goff, II

(57) ABSTRACT

A device for attachment of double-sided adhesive and a method for attachment of the double-sided adhesive are provided. The device includes a driver, a platform and a robot arm provided above the platform. The robot arm is connected with the driver and configured to, under the driving of the driver, place the double-sided adhesive onto a preset position of the platform, strip off the first protective
(Continued)

film of the double-sided adhesive at the preset position, press the printed circuit board assembly (PCBA) at the preset position against the double-sided adhesive without the first protective film, and unload the PCBA attached with the double-sided adhesive from the preset position. A positioning structure is provided at the preset position and configured to secure the adhesive layer and the second protective film when the robot arm strips off the first protective film, and release the securing of the adhesive layer and the second protective film when the double-sided adhesive is attached to the PCBA.

14 Claims, 7 Drawing Sheets

(51) Int. Cl.
- *B32B 37/10* (2006.01)
- *B32B 37/12* (2006.01)
- *B65G 29/00* (2006.01)
- *B65G 47/90* (2006.01)
- *H05K 13/00* (2006.01)
- *H05K 7/14* (2006.01)
- *H05K 3/00* (2006.01)

(52) U.S. Cl.
CPC ............ *B65G 29/00* (2013.01); *B65G 47/90* (2013.01); *H05K 7/1417* (2013.01); *H05K 13/0069* (2013.01); *B32B 2457/08* (2013.01); *H05K 3/0058* (2013.01)

(58) Field of Classification Search
CPC ............ B29B 2017/022; H01L 21/6835; B25J 9/0096; H05K 3/305; H05K 7/147; H05K 13/0069
USPC ................................ 156/247, 249, 719, 767
See application file for complete search history.

(56) References Cited

U.S. PATENT DOCUMENTS

| | | |
|---|---|---|
| 2017/0042041 A1 | 2/2017 | Ge et al. |
| 2017/0259548 A1 | 9/2017 | Zhang et al. |

FOREIGN PATENT DOCUMENTS

| | | |
|---|---|---|
| CN | 102674070 A | 9/2012 |
| CN | 203046422 U | 7/2013 |
| CN | 203730486 U | 7/2014 |
| CN | 104773594 A | 7/2015 |
| CN | 105110061 A | 12/2015 |
| CN | 204917410 U | 12/2015 |
| JP | H336159 A | 2/1991 |
| JP | 201431270 A | 2/2014 |
| KR | 101367367 B1 | 2/2014 |

OTHER PUBLICATIONS

Jun. 22, 2016—(WO) International Search Report Appn PCT/CN2016/072417.
Mar. 20, 2018—(WO) International Preliminary Report on Patentability Appn PCT/CN2016/072417.
Aug. 3, 2016—(CN) First Office Action Appn 201510591922.9 with English Tran.

* cited by examiner

DOUBLE-SIDED ADHESIVE ATTACHING DEVICE AND METHOD FOR ATTACHMENT OF THE DOUBLE-SIDED ADHESIVE

The application is a U.S. National Phase Entry of International Application No. PCT/CN2016/072417 filed on Jan. 28, 2016, designating the United States of America and claiming priority to Chinese Patent Application No. 201510591922.9, filed on Sep. 16, 2015. The present application claims priority to and the benefit of the above-identified applications and the above-identified applications are incorporated by reference herein in their entirety.

TECHNICAL FIELD

Embodiments of the present disclosure relate to a double-sided adhesive attaching device and a method for attachment of the double-sided adhesive.

BACKGROUND

In processes of manufacturing electronic products, a printed circuit board assembly (PCBA) has been widely applied as a support of the electronic components. In order to enable the PCBA to be secured to the whole system of the electronic products and share ground with the same, double-sided adhesive or double-sided conductive adhesive is required to be attached to the back side of the PCBA.

In an existing technique, the double-sided adhesive is attached to the back side of the PCBA manually. However, there are problems of low accuracy and low efficiency for the manual attaching.

SUMMARY

Embodiments of the present disclosure provide a double-sided adhesive attaching device and a method for attachment of the double-sided adhesive.

The embodiments of the present disclosure employ technical solutions as follows.

According to embodiments of the present disclosure, a device for attaching double-sided adhesive onto a printed circuit board is provided. The double-sided adhesive includes an adhesive layer, a first protective film and a second protective film located respectively at two sides of the adhesive layer; the double-sided adhesive attaching device includes a driver, a platform and a robot arm provided above the platform. The robot arm is connected with the driver and configured to, under the driving of the driver, place the double-sided adhesive onto a preset position of the platform, strip off the first protective film of the double-sided adhesive at the preset position, press the printed circuit board against the double-sided adhesive with the first protective film having been stripped off, and unload the printed circuit board attached with the double-sided adhesive from the preset position. The preset position is provided with a positioning structure, which is configured to secure the adhesive layer and the second protective film when the robot arm is stripping off the first protective film, and to release the securing of the adhesive layer and the second protective film when the double-sided adhesive is attached to the printed circuit board.

In an example, the platform is connected with the driver to allow the platform to rotate under the driving of the driver. The robot arm includes an arm for the double-sided adhesive and an arm for the circuit board; the preset position includes a first position and a second position. The arm for the double-sided adhesive is located at the first position to allow double-sided adhesive to be placed on the positioning structure, and the first protective film of the double-sided adhesive to be stripped off so as to expose the first adhesive surface when the platform rotates a positioning structure to the first position. The arm for the circuit board is located at the second position to allow the printed circuit board to be pressed onto a first adhesive surface of the double-sided adhesive at the second position, and the printed circuit board attached with the double-sided adhesive to be unloaded from the second position when the platform rotates the double-sided adhesive at the first position to the second position.

In an example, the platform is connected with the driver to allow the platform to rotate under the driving of the driver. The robot arm includes a first arm for the double-sided adhesive, a second arm for the double-sided adhesive, a first arm for the circuit board, a second arm for the circuit board; the preset position includes a first position, a second position, a third position and a fourth position. The first arm for the double-sided adhesive is located at the first position to allow double-sided adhesive to be placed on the positioning structure when the platform rotates a positioning structure to the first position. The second arm for the double-sided adhesive is located at the second position to allow the first protective film of the double-sided adhesive at the second position to be stripped off so as to expose the first adhesive surface when the platform rotates the double-sided adhesive at the first position to the second position. The first arm for the circuit board is located at the third position to allow the printed circuit board to be pressed onto the first adhesive surface of the double-sided adhesive at the third position when the platform rotates the double-sided adhesive at the second position to the third position. The second arm for the circuit board is located at the fourth position to allow the printed circuit board attached with the double-sided adhesive to be unloaded from the fourth position when the platform rotates the double-sided adhesive at the third position to the fourth position.

In an example, the positioning structure includes a restricting groove provided at the platform, and the restricting groove has a depth greater than thickness of the double-sided adhesive.

In an example, the positioning structure further includes two pins fixed to a bottom surface of the restricting groove, and the pins are configured to pass through holes at two ends of the double-sided adhesive, respectively.

In an example, the positioning structure further includes at least one lift device located inside of the platform at a position corresponding to the restricting groove. The lift device includes a pneumatic bar and a cylinder, one end of the pneumatic bar being equipped with a piston located inside of the cylinder, and the other end of the pneumatic bar being equipped with a suction cup. The bottom surface of the restricting groove is provided with a through-hole at a position corresponding to the pneumatic bar, the through-hole being configured in such a way that the pneumatic bar, when passing through the through-hole, brings the suction cup into contact with the double-sided adhesive in the restricting groove.

In an example, the positioning structure further includes a pneumatic supply. The pneumatic bar is provided with a gas passage, one end of the gas passage communicating with a bottom of the suction cup, and the other end of the gas passage being connected with the pneumatic supply so as to receive gas provided by the pneumatic supply or to discharge the gas in the gas passage to the pneumatic supply. The cylinder is provided with gas inlet/outlet port at its side wall, the gas inlet/outlet port communicating with the pneumatic supply to receive the gas provided by the pneumatic supply or to discharge the gas in the cylinder to the pneumatic supply.

According to embodiments of the present disclosure, a method for attachment of the double-sided adhesive by utilizing the double-sided adhesive attaching device is provided, including: placing the double-sided adhesive onto a preset position of the platform by utilizing a robot arm; securing the adhesive layer and the second protective film of the double-sided adhesive by utilizing a positioning structure; stripping off the first protective film of the double-sided adhesive at the preset position by utilizing the robot arm; pressing the printed circuit board against the double-sided adhesive without the first protective film at the preset position by utilizing the robot arm; releasing the securing of the adhesive layer and the second protective film by utilizing the positioning structure; and unloading the printed circuit board attached with the double-sided adhesive from the preset position by utilizing the robot arm.

In an example, under a condition of the robot arm including an arm for the double-sided adhesive and an arm for the circuit board, and the preset position includes a first position and a second position, rotating the platform to rotate the positioning structure to the first position; placing the double-sided adhesive onto the positioning structure by utilizing the arm for the double-sided adhesive located at the first position; securing the adhesive layer and the second protective film of the double-sided adhesive by utilizing the positioning structure; stripping off the first protective film of the double-sided adhesive so as to expose the first adhesive surface by utilizing the arm for the double-sided adhesive located at the first position; rotating the platform to rotate the double-sided adhesive at the first position to the second position; pressing the printed circuit board onto the first adhesive surface of the double-sided adhesive at the second position by utilizing the arm for the circuit board at the second position; releasing the securing of the adhesive layer and the second protective film by utilizing the positioning structure; and unloading the printed circuit board attached with the double-sided adhesive from the second position by utilizing the arm for the circuit board at the second position.

In an example, under a condition of the robot arm including a first arm for the double-sided adhesive, a second arm for the double-sided adhesive, a first arm for the circuit board, a second arm for the circuit board, and the preset position includes a first position, a second position, a third position and a fourth position, rotating the platform to rotate the positioning structure to the first position; placing the double-sided adhesive onto the positioning structure by utilizing the first arm for the double-sided adhesive; rotating the platform to rotate the double-sided adhesive at the first position to the second position; securing the adhesive layer and the second protective film of the double-sided adhesive by utilizing the positioning structure; stripping off the first protective film of the double-sided adhesive at the second position, to expose the first adhesive surface by utilizing the second arm for the double-sided adhesive; rotating the platform to rotate the double-sided adhesive at the second position to the third position; pressing the printed circuit board against the first adhesive surface of the double-sided adhesive at the third position by utilizing the first arm for the circuit board; rotating the platform to rotate the double-sided adhesive at the third position to the fourth position; releasing the securing of the adhesive layer and the second protective film by utilizing the positioning structure; and unloading the printed circuit board attached with the double-sided adhesive from the fourth position by utilizing the second arm for the circuit board.

In an example, under a condition of the positioning structure including a lift device and a pneumatic supply, the securing provided by the positioning structure against the adhesive layer and the second protective film, the pneumatic supply acts on the cylinder through the gas inlet/outlet port so that the pneumatic bar moves in a direction toward the second protective film of the double-sided adhesive, the suction cup contacts the second protective film of the double-sided adhesive; the pneumatic supply discharges the gas between the suction cup and the second protective film through the gas passage, so that the suction cup is adsorbed to the second protective film.

In an example, under a condition of the positioning structure including a lift device and a pneumatic supply, releasing the securing of the adhesive layer and the second protective film by the positioning structure includes: the pneumatic supply inflates a space between the suction cup and the second protective film through the gas passage, so that the suction cup disengages from the second protective film of the double-sided adhesive; and the pneumatic supply acts on the cylinder through the gas inlet/outlet port so that the pneumatic bar moves in a direction away from the second protective film.

The embodiments of the present disclosure provide a double-sided adhesive attaching device and a method for attachment of the double-sided adhesive. The double-sided adhesive attaching device is configured to attach double-sided adhesive to the printed circuit board, the double-sided adhesive including an adhesive layer and a first film and a second protective film located at two sides of the adhesive layer, respectively. The double-sided adhesive attaching device includes a driver, a platform and a robot arm provided above the platform. The robot arm is connected with the driver and configured to, under the driving of the driver, place the double-sided adhesive onto the preset position of the platform, strip off the first protective film of the double-sided adhesive at the preset position, press the printed circuit board against the double-sided adhesive with the first protective film having been stripped off, and unload the printed circuit board attached with the double-sided adhesive from the preset position. The preset position is provided with a positioning structure, which is configured to secure the adhesive layer and the second protective film when the robot arm is stripping off the first protective film, and to release the securing of the adhesive layer and the second protective film when the double-sided adhesive is attached to the printed circuit board.

BRIEF DESCRIPTION OF THE DRAWINGS

Embodiments of the present disclosure will be described in detail hereinafter in conjunction with accompanying drawings to allow one of ordinary skill in the art to understand the present disclosure more clearly, in which:

FIG. 2b is a top view of the double-sided adhesive of FIG. 2a;

FIG. 4b is a structural schematic view of the lift device of FIG. 4a;

FIG. 7 is a flow chart illustrating attaching the double-sided adhesive by the double-sided adhesive attaching device as shown in FIG. 3a.

DETAILED DESCRIPTION

Technical solutions of the embodiments will be described in a clearly and fully understandable way connected with the drawings related to the embodiments of the disclosure. It is apparent that the described embodiments are just a part but not all of the embodiments of the disclosure. Based on the described embodiments herein, those skilled in the art can obtain other embodiment(s), without any inventive work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "a/an," "the," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and if the position of the object which is described is changed, the relative position relationship may be changed accordingly.

Figure 2A:
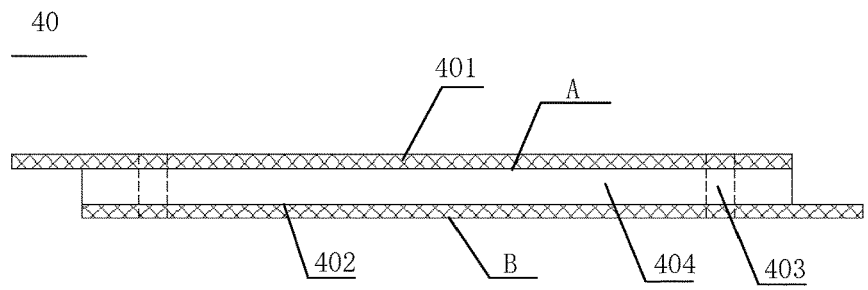
FIG. 2a is a structural schematic view of the double-sided adhesive of FIG. 1 located in the positioning structure.

An embodiment of the present disclosure provides a device for attaching double-sided adhesive at the back side of the PCBA. The double-sided adhesive 40 includes an adhesive layer 404, as shown in FIG. 2a, and the adhesive layer 404 has two adhesive surfaces opposite to each other, i.e., the first adhesive surface A and the second adhesive surface B, for attaching to components. The first adhesive surface A and the second adhesive surface B are provided with a first protective film 401 and a second protective film 402, respectively, for protecting the adhesive surfaces from contamination and avoiding depression in its adhesive capability before the double-sided adhesive 40 being adhered to the components.

The device for attachment of double-sided adhesive may include a driver, a platform and a robot arm provided above the platform.

The robot arm is connected with the driver and configured to, under the driving of the driver, place the double-sided adhesive onto a preset station of the platform, strip off the first protective film 401 of the double-sided adhesive at the preset station, press the PCBA onto the double-sided adhesive 40 with the first protective film 401 having been stripped off, and unload the PCBA attached with the double-sided adhesive 40 from the preset station.

A positioning structure is provided at the preset station for securing the adhesive layer 404 and the second protective film 402 when the robot arm strips off the first protective film 401, and for releasing the securing of the adhesive layer 404 and the second protective film 402 when the double-sided adhesive 40 is attached onto the PCBA.

It is noted that the lifting member of the robot arm in the embodiment of the present disclosure may be a vacuum chuck, and in an instance that the robot arm is required to lift articles, the vacuum chuck can be evacuated so that the suction cup is adsorbed to the surface of the article, but in an instance that the robot arm is required to put down the article, gas can be filled into the vacuum chuck to destroy the vacuum environment and thus allow the vacuum chuck to detach from the surface of the article. Moreover, when the first protective film 401 is to be stripped off by the robot arm, the vacuum chuck can be adsorbed at one end of the first protective film 401, i.e., as shown in FIG. 2a, at a position below the first protective film 401 without no adhesive layer 404, such that, when the robot arm moves upward, it is possible to detach the first protective film 401 from the first adhesive surface A. Moreover, the lifting member of the robot arm can also be a mechanical clamp with higher accuracy and small size. The present disclosure has no restriction to the specific structure of the robot arm, such that it is possible to lift up or down the double-sided adhesive 40 and PCBA and strip off the protective films of the double-sided adhesive 40. The vacuum chuck is simple and inexpensive to operate compared with the mechanical clamp, it is preferable that the vacuum chuck is used as the lifting member of the robot arm, for example.

The embodiment of the present disclosure provides a device for attaching the double-sided adhesive at the back side of the printed circuit board, the double-sided adhesive includes an adhesive layer and a first film and a second protective film located at two sides of the adhesive layer, respectively. The double-sided adhesive attaching device includes a driver, a platform and a robot arm provided above the platform. The robot arm is connected with the driver and configured to, under the driving of the driver, place the double-sided adhesive onto the preset position of the platform, strip off the first protective film of the double-sided adhesive at the preset position, press the printed circuit board against the double-sided adhesive with the first protective film having been stripped off, and unload the printed circuit board attached with the double-sided adhesive from the preset position. A positioning structure is provided at the preset position, and the positioning structure is configured to secure the adhesive layer and the second protective film when the robot arm is stripping off the first protective film, and to release the securing of the adhesive layer and the second protective film when the double-sided adhesive is adhered onto the printed circuit board.

In this way, on one hand, in the whole process of attaching the double-sided adhesive, the robot arm is used to lift the printed circuit board and strip off the first protective film of the double-sided adhesive during the lifting process, and press the printed circuit board onto the double-sided adhesive with the first protective film having been stripped off. And the positioning structure can secure the second protective film and the adhesive layer of the double-sided adhesive in the process of stripping off the first protective film by the robot arm, to prevent the robot arm from taking off the double-sided adhesive directly from the preset position in the process of stripping off the protective film. The positioning structure can also release the securing of the adhesive layer and the second protective film when the robot arm is required to unload the printed circuit board attached with the double-sided adhesive from the platform. No manual operation is needed in the attaching process and the attaching efficiency can be improved. On the other hand, under the control of the driver, the robot arm can attach the double-sided adhesive in higher alignment accuracy than manual operation.

It is noted that the attaching process of the robot arm attaching the double-sided adhesive 40 onto the PCBA may include:

A first process: the robot arm picking-up double-sided adhesive 40, and placing the double-sided adhesive 40 at a preset position on the platform.

A second process: strip off a first protective film 401 on an adhesive surface of the double-sided adhesive 40 adjacent to the robot arm (in the following embodiments, taking the first adhesive surface A adjacent to the robot arm as an example) by utilizing the robot arm.

A third process: the robot arm picking-up a PCBA, and, at the preset position, pressing the PCBA onto the double-sided adhesive 40 with the first protective film 401 having been stripped off A fourth process: the robot arm unloading the PCBA attached with the double-sided adhesive 40 from the platform 20.

Based on the above, the present disclosure has no restriction upon the quantity of the robot arms. It is possible to perform all of the processes using only one robot arm, and it is also possible to divide the work among several robot arms. Hereinafter, several exemplary embodiments are provided to illustrate in detail the case where several robot arms are used to achieve the attaching process.

Embodiment 1

Figure 1:
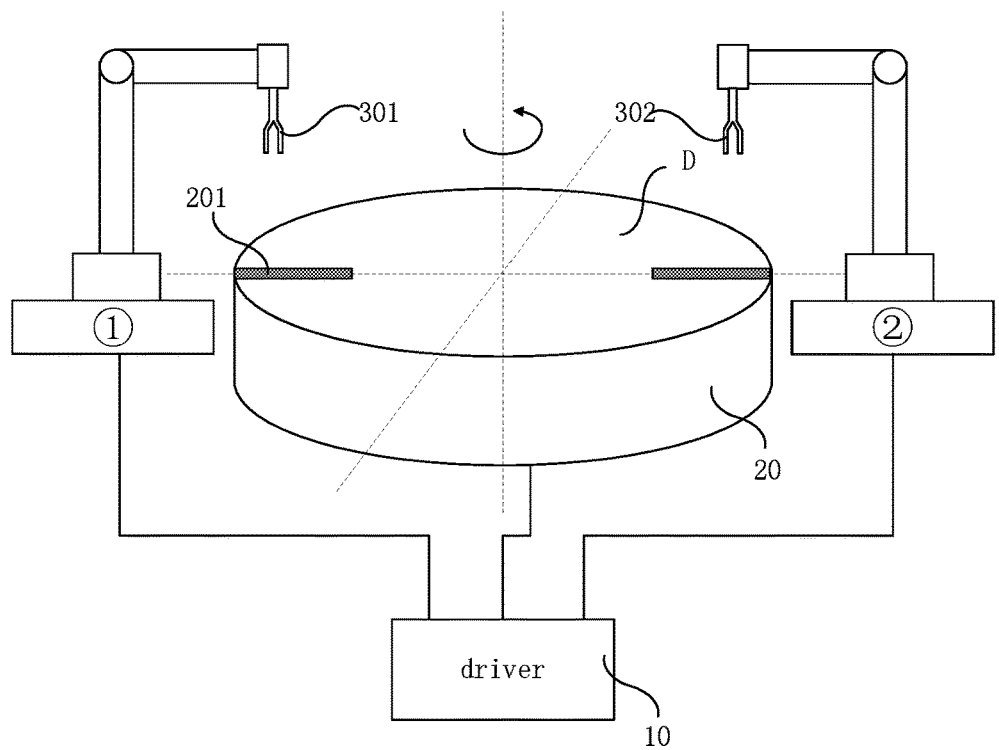
FIG. 1 is a structural schematic view of a double-sided adhesive attaching device provided by an embodiment of the present disclosure.

As shown in FIG. 1, the robot arm of this embodiment includes an arm 301 for the double-sided adhesive and an arm 302 for the circuit board, the preset position includes a first position (1) and a second position (2).

In this instance, the platform 20 is connected with the driver 10 to rotate under the driving of the driver 10. The platform 20 can have a clockwise rotation and can also have a counterclockwise rotation; however, the present disclosures are not limited thereto.

Based on this, the arm 301 for the double-sided adhesive is located at the first position (1), and when the platform 20 rotates a positioning structure 201 to the first position (1), the arm 301 for the double-sided adhesive is used to place double-sided adhesive 40 onto the positioning structure 201 and strip off a first protective film 401 of the double-sided adhesive to expose a first adhesive surface A.

The arm 302 for the circuit board is located at the second position (2), and when the platform 40 rotates the double-sided adhesive 40 at the first position (1) to the second position (2), the arm 302 for the circuit board presses the PCBA onto the first adhesive surface A of the double-sided adhesive 40 at the second position (2) and unloads the PCBA attached with the double-sided adhesive 40 from the second position (2 ).

Due to the significant difference between the weights of the double-sided adhesive 40 and the PCBA, in an instance that only one robot arm is used to lift up or down the double-sided adhesive 40 and the PCBA, it is required to provide different procedures to control the robot arm in such a way that the robot arm could have a proper force strength, so that the double-sided adhesive 40 or the PCBA is not damaged while lifting up or down the double-sided adhesive 40 or the PCBA. For example, if the procedures are not changed, by employing a force strength for lifting up or down the double-sided adhesive 40, the robot arm could not lift up or down the PCBA, and if the robot arm lifts up or down the double-sided adhesive 40 by employing a force strength for lifting up or down the PCBA, the double-sided adhesive 40 is easy to be damaged. Therefore, in this embodiment, the arm 301 for the double-sided adhesive only performs operation on the double-sided adhesive 40, and the arm 302 for the circuit board only performs operation on the PCBA. In this way, it is possible to avoid inconvenience caused by the modification of the operation procedures of the robot arm as required for lifting up or down articles of different weights, and the manufacturing process is simplified.

Moreover, the platform 20 of this embodiment may be provided with two positioning structures 201 thereon, each corresponding to one position, and in this instance, both of the two robot arms can be in their operative mode, and the production efficiency is improved.

Embodiment 2

Figure 3A:
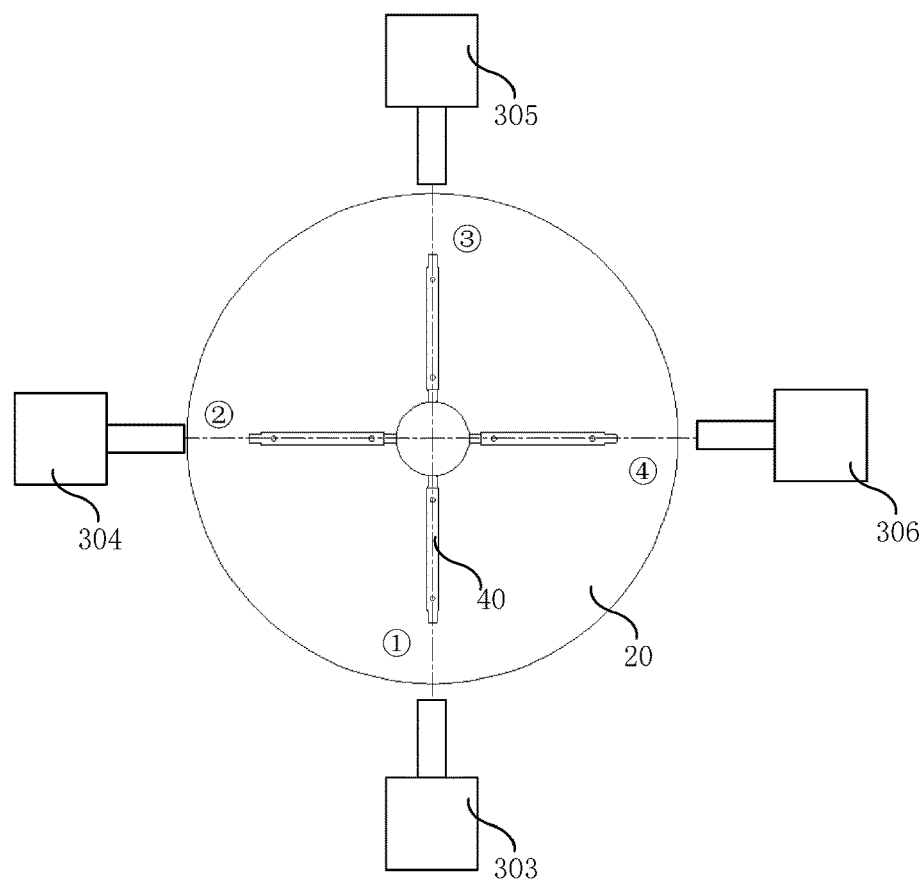
FIG. 3a is a structural schematic view showing the platform of FIG. 1 provided with four positioning structures.

As shown in FIG. 3a, the robot arm of this embodiment may include a first arm 303 for the double-sided adhesive, a second arm 304 for the double-sided adhesive, a first arm 305 for the circuit board and a second arm 306 for the circuit board. The preset position includes a first position (1), a second position (2), a third position (3) and a fourth position (4).

In this instance, the platform 20 is connected with the driver 10 to rotate under the driving of the driver 10.

Based on this, the first arm 303 for the double-sided adhesive is located at the first position (1) to allow, when the platform 20 rotates a positioning structure 201 to the first position (1), double-sided adhesive 40 to be placed on the positioning structure 201.

The second arm 304 for the double-sided adhesive is located at the second position (2) to allow, when the platform 20 rotates the double-sided adhesive at the first position (1) to the second position (2), the first protective film 401 of the double-sided adhesive 40 at the second position (2) to be stripped off so as to expose the first adhesive surface A.

The first arm 305 for the circuit board is located at the third position (3) to allow, when the platform 20 rotates the double-sided adhesive 40 at the second position (2) to the third position (3), the printed circuit board to be pressed onto the first adhesive surface A of the double-sided adhesive 40 at the third position (3).

The second arm 306 for the circuit board is located at the fourth position (4) to allow, when the platform 40 rotates the double-sided adhesive 40 at the third position (3) to the fourth position (4), the printed circuit board attached with the double-sided adhesive 40 to be unloaded from the fourth position (4).

As a result, the action performed by each of the robot arms is more simple than that in the first embodiment, and thus the manipulation becomes easier. Moreover, the platform 20 is provided with four positioning structures 201 thereon, each of the positioning structures 201 corresponding to one position, in this way, each of the four robot arms can be in its operative mode to simultaneously execute the four processes respectively, and the production efficiency is improved.

Figure 3B:
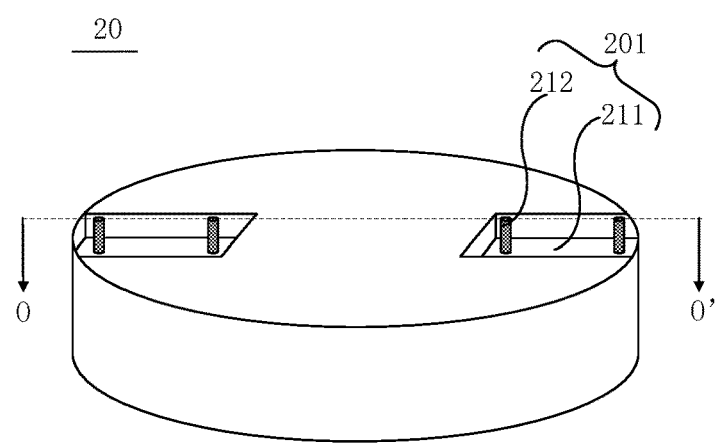
FIG. 3b is a structural schematic view showing the positioning structures on the platform of FIG. 1.

For both the first and second embodiments, as shown in FIG. 3b, the positioning structure 201 may include a restricting groove 211 provided on the platform 20. In this way, the position of the double-sided adhesive 40 can be restricted in the restricting groove 211.

It is noted that the present disclosure has no restriction upon the way by which to provide the restricting groove 211, the restricting groove 211 may be provided on the platform transversely or longitudinally, for example. For the double-sided adhesive 40 of a longer length, the restricting groove 211 may be preferably provided in the radius direction of the platform 20, as shown in FIG. 3a, for example. The four double-sided adhesives 40 are located within four restricting grooves 211, respectively, and the four restricting grooves 211 correspond to the position (1), the position (2), the position (3) and the position (4), respectively. In this way, for a platform provided with several restricting grooves, for example, four restricting grooves 211, the upper surface of the platform 201 can be utilized much more efficient so as to avoid the occurrence of dimensional interference between adjacent restricting grooves 211.

Figure 2B:

Moreover, to facilitate the placement of the double-sided adhesive 40 being placed into the restricting groove 211 by the arm 30, the width and length of the restricting groove 211 are usually set to be slightly greater than the width and length of the double-sided adhesive 40. However, when the surface PCBA is pressed onto the first adhesive surface A of the double-sided adhesive, the double-sided adhesive 40 would be move in the groove 211, and the alignment accuracy of attachment will be decreased. Therefore, in order to better define the position of the double-sided adhesive 40, as shown in FIG. 2b (the top view of FIG. 2a), each of the two ends of the double-sided adhesive 40 can be provided with a hole 403.

In this instance, as shown in FIG. 3b, the positioning structure 201 may also include two pins 212 fixed to the bottom surface of the restricting groove 211. each of the positions of the two pins 212 correspond to the position of the double-sided adhesive 40, so that the pins 212 can pass through the holes 403 at two ends of the double-sided adhesive 40.

For example, since the size of the PCBA is larger than the double-sided adhesive 40, when the arm 30 presses the PCBA onto the double-sided adhesive 40, the remaining part of the PCBA without double-sided adhesive 40 attached thereto would contact the upper surface D of the platform 20 as shown in FIG. 1. Therefore, if the upper surface of the double-sided adhesive 40 (i.e., the surface of the first protective film 401) protrudes from the upper surface D of the platform 20, since the first protective film 401 has a less thickness, when the first protective film 401 is stripped off, the first adhesive surface A would also be higher than the upper surface D of the platform 20. In this way, when the arm 30 presses the PCBA onto the double-sided adhesive 40, the protruding double-sided adhesive will disable the lower surface of the PCBA flatly contacting the upper surface D of the platform 20, so that the PCBA is subjected to an uneven force and is liable to be damaged.

To solve the problem, the depth of the restricting groove 211 may be greater than the thickness of the double-sided adhesive 40, so that, when the suction cup 504 is attracted to the lower surface of the double-sided adhesive 40 (i.e., the surface of the second protective film 402), the upper surface of the double-sided adhesive (i.e., the surface of the first protective film 401) is lower than the upper surface D of the platform (as shown in FIG. 1).

Figure 4A:
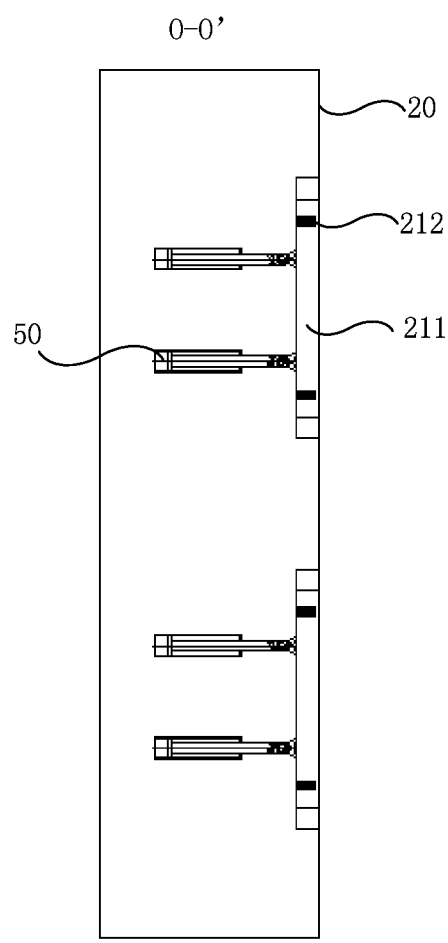
FIG. 4a is a sectional view along the line O-O' of FIG. 3b.

Based on this, as shown in FIG. 4a (the sectional view along line O-O' of FIG. 3b), the positioning structure 201 also includes at least one lift device 50 located inside the platform 20 at a position corresponding to the restricting groove 211.

Figure 4B:
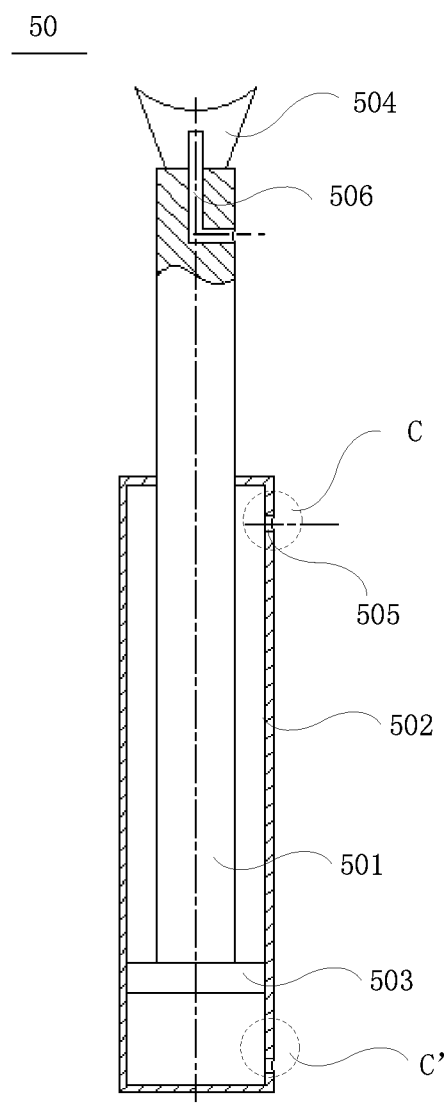

For example, as shown in FIG. 4b, the lift device 50 may include a pneumatic bar 501 and a cylinder 502. One end of the pneumatic bar 501 is equipped with a piston 503 located within the cylinder 502, and the other end of the pneumatic bar 501 is equipped with a suction cup 504.

The bottom surface of the restricting groove 211 is provided with a through-hole (not shown) at a position corresponding to the pneumatic bar 501. The through-hole is used to allow, when the pneumatic bar 501 passes through the through-hole, the suction cup 504 being contact the double-sided adhesive located in the restricting groove 211.

In this way, during the process of stripping off the first protective film by the robot arm, the positioning structure can act on the piston 503 with the gas pressure in the cylinder 502, so that the piston 503 pushes the pneumatic bar 501 to move upward, and the suction cup 504 can pass through the through-hole and contact the second protective film 402 provided at the second adhesive surface B of the double-sided adhesive 40, so that the double-sided adhesive 40 is adsorbed to the suction cup 504 and the second protective film 402 and the adhesive layer 404 of the double-sided adhesive 40 are secured to prevent the double-sided adhesive 40 from being directly taking away from the preset position during the process of stripping off the protective film by the robot arm.

Next, in the third process, that is to say, when the robot arm picks-up the PCBA and presses the PCBA onto the double-sided adhesive 40 with the first protective film 401 having been stripped off, according to the preset adhering position, the gas pressure within the cylinder 502 can act on the piston 503 so that the piston 503 pushes the pneumatic bar 501 to move further upward, the double-sided adhesive 40 can move upward, while the robot arm presses the PCBA to move downward, to allow both the upper and lower surfaces of the double-sided adhesive 40 to subject a force, which facilitates to provide adhesion to the PCBA.

Moreover, after the third process is completed, the pneumatic bar 501 moves downward under the action of the gas pressure in the cylinder 502, so that the suction cup 504 is no longer adsorbed on the double-sided adhesive 40, to allow, in the following fourth process, the arm 30 to easily unload the PCBA attached with the double-sided adhesive 40 from the platform 20. As a result, the securing of the adhesive layer 404 and the second protective film 402 is released.

Based on this, to facilitate the control of the direction of the gas pressure in the cylinder 502, the double-sided adhesive attaching device may also include a pneumatic supply (not shown). The pneumatic supply may be an air compressor.

Based on this, as shown in FIG. 4b, the side wall of the cylinder 502 can be provided with a gas inlet/outlet port 505 thereon. The gas inlet/outlet port 505 is communicated with the pneumatic supply for receiving the gas provided by the pneumatic supply, or for discharging the gas in the cylinder 502 to the pneumatic supply.

It is noted that in an instance that the side wall of the cylinder 502 is provided with one gas inlet/outlet port 505 and the position of the gas inlet/outlet port 505 changes, the gas acting on the pneumatic bar 201 will flow in and out in different directions. For example, in a case where the position of the gas inlet/outlet port 505 is located above the piston 503 (the position C as shown in FIG. 4b), if the piston 503 needs to move upward to urge the pneumatic bar 501 upward such that the suction cup 504 is adsorbed to the double-sided adhesive 40, the pneumatic supply needs to draw out the gas in the cylinder 502, so that the gas is discharged to the pneumatic supply through the gas inlet/outlet port 502. If the piston 503 needs to move downward to urge the pneumatic bar 501 downward so that the suction cup 504 is disengaged from the double-sided adhesive 40, the pneumatic supply supplies gas into the cylinder 502.

Alternatively, in the case where the position of the gas inlet/outlet port 505 is located below the piston 503 (position C' as shown in FIG. 4b), if the piston 503 needs to move upward to urge the pneumatic bar 501 upward so that the suction cup 504 is adsorbed to the double-sided adhesive 40, the pneumatic supply needs to supply gas to the cylinder 502. If the piston 503 needs to move downward to urge the pneumatic bar 501 downward so that the suction cup 504 is disengaged from the double-sided adhesive 40, the pneumatic supply draws out the gas in the cylinder 502 so that the gas passes through the gas inlet/outlet port 502 to the pneumatic supply.

Moreover, when the side wall of the cylinder 502 is provided with one gas inlet/outlet port 505 at each of positions C and C' as shown in FIG. 4b, respectively, the pneumatic supply could supply gas to one of the gas inlet/outlet ports 505, and discharge the gas in the cylinder 502 through the other one of the gas inlet/outlet ports 505. The inflow and outflow directions of the gas and the moving direction of the pneumatic bar 501 are the same as described above; no description is repeated herein.

For example, to facilitate control of the suction cup 504, as shown in FIG. 4b, the pneumatic bar 501 may be provided with a gas passage 506, one end of the gas passage 506 communicates with the bottom of the suction cup 504, and the other end of the gas passage 506 communicates with the pneumatic supply, for receiving the gas provided by the pneumatic supply or discharging the gas in the gas passage 506 to the pneumatic supply. For example, if it is desired to adsorb the suction cup 504 onto the double-sided adhesive 40, the pneumatic supply discharges the air between the suction cup 504 and the second protective film 402 of the double-sided adhesive 40 to the pneumatic supply through the gas passage 506. For example, if it is desired to disengage the suction cup 504 from the double-sided adhesive 40, gas can be supplied into the gas passage 506 through the pneumatic supply so that the gas is filled between the suction cup 504 and the second protective film 402 of the double-sided adhesive 40. As a result, it is possible to achieve the automatic absorption and detachment of the suction cup 504.

Figure 5:
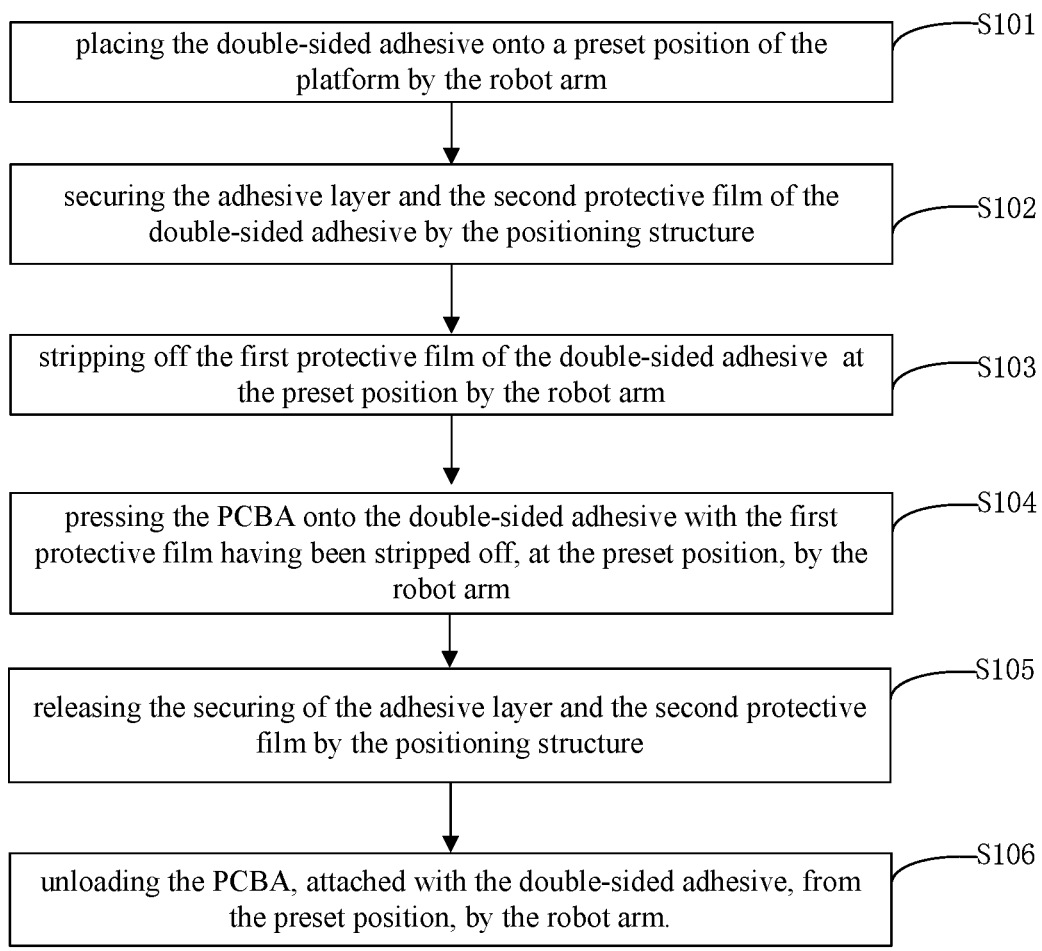
FIG. 5 is a flow chart showing a method for attachment of the double-sided adhesive provided by an embodiment of the present disclosure.

Embodiments of the present disclosure provide a method for attachment of the double-sided adhesive using any one of the double-sided adhesive attaching devices as mentioned, as shown in FIG. 5, the method includes:

S101, placing the double-sided adhesive 40 onto a preset position of the platform 20 by the robot arm.

S102, securing the adhesive layer 404 and the second protective film 402 of the double-sided adhesive 40 by the positioning structure 201.

S103, stripping off the first protective film 401 of the double-sided adhesive 40 at the preset position by the robot arm.

S104, pressing the PCBA onto the double-sided adhesive 40 with the first protective film 401 having been stripped off, at the preset position, by the robot arm.

S105, releasing the securing of the adhesive layer 404 and the second protective film 402 by the positioning structure 201.

S106, unloading the PCBA, attached with the double-sided adhesive 40, from the preset position, by the robot arm.

In this way, on one hand, in the whole process of attachment of the double-sided adhesive, the robot arm is used to lift up or down the double-sided adhesive and the printed circuit board, and to strip off the first protective film of the double-sided adhesive in the process of lifting, and press the printed circuit board onto the double-sided adhesive with the first protective film having been stripped off. And during the process of stripping off the first protective film by the robot arm, the positioning structure can secure the second protective film and the adhesive layer of the double-sided adhesive, to prevent the robot arm from taking the double-sided adhesive directly away from the preset position in the process of stripping off the protective film. The positioning structure can release the securing of the adhesive layer and the second protective film if the robot arm is required to unload the printed circuit board attached with the double-sided adhesive from the platform. In this way, no manual operation is needed in the attaching process and thus the attaching efficiency can be improved. On the other hand, due to the control of the driver, the robot arm can attach the double-sided adhesive in higher alignment accuracy than the manual operation.

Based on this, if the number of the robot arms is different, the method for attachment of the double-sided adhesive is not the same. The method for attachment of the double-sided adhesive by several robot arms will be illustrated in detail below.

Embodiment 3

As shown in FIG. 1, the robot arm of this embodiment includes an arm 301 for the double-sided adhesive and an arm 302 for the circuit board, and the preset position includes a first position (1) and a second position (2).

Figure 6:
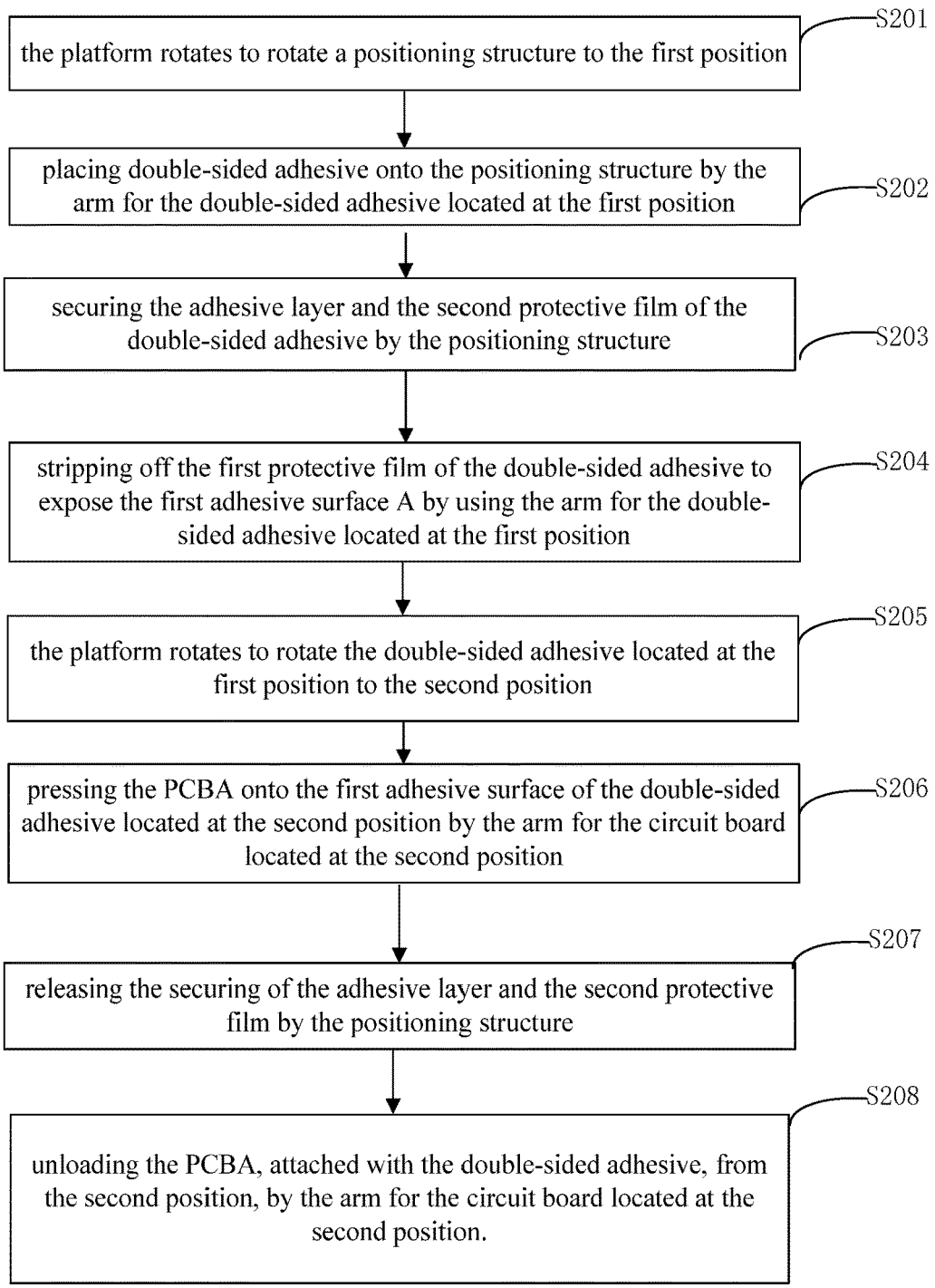
FIG. 6 is a flow chart illustrating attaching the double-sided adhesive by the double-sided adhesive attaching device as shown in FIG. 1.

In this instance, as shown in FIG. 6, the method includes:

S201, the platform 20 rotates to rotate a positioning structure 201 to the first position (1).

S201, placing double-sided adhesive 40 onto the positioning structure 201 by the arm 301 for the double-sided adhesive located at the first position (1).

S203, securing the adhesive layer 404 and the second protective film 402 of the double-sided adhesive 40 by the positioning structure 201.

S204, stripping off the first protective film 401 of the double-sided adhesive 40 to expose the first adhesive surface A by using the arm 301 for the double-sided adhesive located at the first position (1).

S205, the platform 20 rotates to rotate the double-sided adhesive 40 located at the first position (1) to the second position (2).

S206, pressing the PCBA onto the first adhesive surface A of the double-sided adhesive 40 located at the second position (2) by the arm 302 for the circuit board located at the second position (2).

S207, releasing the securing of the adhesive layer 404 and the second protective film 402 by the positioning structure 201.

S208, unloading the PCBA, attached with the double-sided adhesive 40, from the second position (2) by the arm 302 for the circuit board located at the second position (2).

Due to the significant difference between the weights of the double-sided adhesive 40 and the PCBA, in an instance that only one robot arm is used to lift up or down the double-sided adhesive 40 and the PCBA, it is needed to provide different procedures to control the robot arm in such a way that the robot arm could have a proper force strength, so that the double-sided adhesive 40 or the PCBA is not damaged while the lifting up or down of the double-sided adhesive 40 or the PCBA being achieved. For example, if the procedures are not changed, the robot arm, employing force strength for lifting up or down the double-sided adhesive 40, would be unable to lift up or down the PCBA, and when the robot arm lifts up or down the double-sided adhesive 40 employing the force strength for lifting up or down the PCBA, the double-sided adhesive 40 is easy to be damaged. Therefore, in this embodiment, the arm 301 for the double-sided adhesive only perform operation upon the double-sided adhesive 40, and the arm 302 for the circuit board only perform operation upon the PCBA. In this way, it is possible to avoid inconvenience caused by the modification of the operation procedures of the robot arm as required for lifting articles of different weights, and the manufacturing process is simplified.

Moreover, the platform 20 of this embodiment may be provided with two positioning structures 201 thereon, each of which corresponds to one position. In this way, both of the two robot arms can be in their operative mode, and the production efficiency is improved.

Embodiment 4

As shown in FIG. 3a, the robot arm of this embodiment may include a first arm 303 for the double-sided adhesive, a second arm 304 for the double-sided adhesive, a first arm 305 for the circuit board and a second arm 306 for the circuit board. The preset position includes a first position (1), a second position (2), a third position (3) and a fourth position (4).

Figure 7:
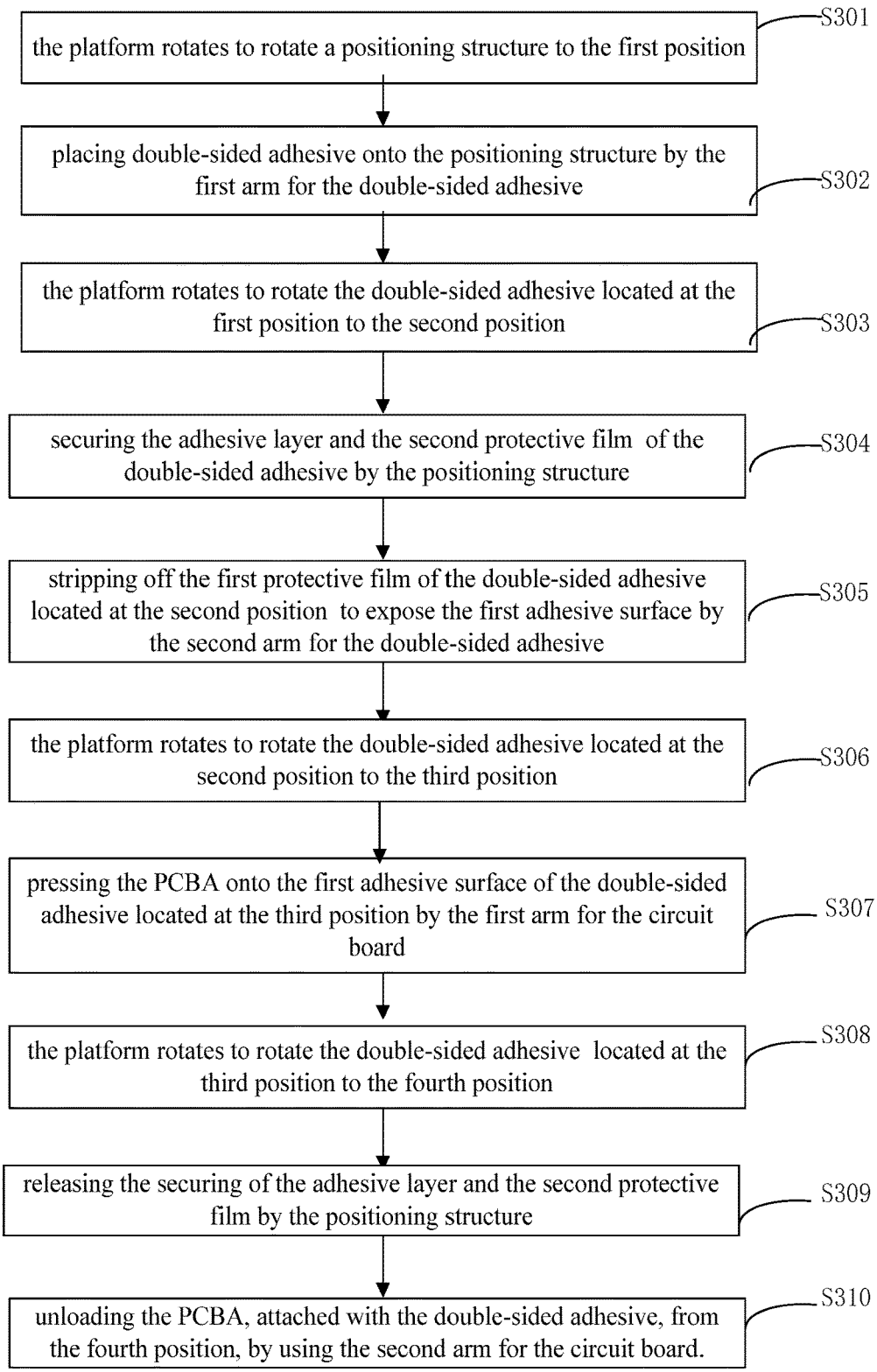

In this instance, as shown in FIG. 7, the method includes:

S301, the platform 20 rotates to rotate a positioning structure 201 to the first position (1).

S302, placing double-sided adhesive 40 onto the positioning structure 201 by the first arm 303 for the double-sided adhesive.

S303, the platform 20 rotates to rotate the double-sided adhesive 40 located at the first position (1) to the second position (2).

S304, securing the adhesive layer 404 and the second protective film 402 of the double-sided adhesive 40 by the positioning structure 201.

S305, stripping off the first protective film 404 of the double-sided adhesive 40 located at the second position (2) to expose the first adhesive surface A by the second arm 304 for the double-sided adhesive.

S306, the platform rotates to rotate the double-sided adhesive 40 located at the second position (2) to the third position (3).

S307, pressing the PCBA onto the first adhesive surface A of the double-sided adhesive 40 located at the third position (3) by the first arm 305 for the circuit board.

S308, the platform 20 rotates to rotate the double-sided adhesive 40 located at the third position (3) to the fourth position (4).

S309, releasing the securing of the adhesive layer 404 and the second protective film 402 by the positioning structure 201.

S310, unloading the PCBA, attached with the double-sided adhesive 40, from the fourth position (4), by using the second arm 306 for the circuit board.

In this way, the action performed by each of the robot arms is more simple than that of the third embodiment, and thus the manipulation becomes easier. Moreover, the platform 20 is provided with four positioning structures 201 thereon, each of the positioning structures 201 corresponding to one position. In this case, each of the four robot arms can be in its operative mode while simultaneously executing the four processes respectively, thus the production efficiency is further improved.

For both the third and fourth embodiments as described above, the positioning structure 201 includes a lift device 50 and a pneumatic supply, the securing of the adhesive layer 404 and second protective film 402 by the positioning structure 201 includes:

Firstly, the pneumatic supply acts on the cylinder 502 through the gas inlet/outlet port so that the pneumatic bar 501 moves in a direction toward the second protective film 402 of the double-sided adhesive 40, and the suction cup 504 contacts the second protective film 402 of the double-sided adhesive 40.

It is noted that in an instance that the side wall of the cylinder 502 is provided with one gas inlet/outlet port 505 and the position of the gas inlet/outlet port 505 changes, the gas acting on the pneumatic bar 201 will flow in and out in different directions. For example, in the case where the position of the gas inlet/outlet port 505 is located above the piston 503 (the position C as shown in FIG. 4b), if the piston 503 needs to move upward (that is, to allow the pneumatic bar 501 to move in a direction adjacent to the second protective film 402 of the double-sided adhesive 40) to urge the pneumatic bar 501 upward such that the suction cup 504 contacts the second protective film 402 of the double-sided adhesive 40, the pneumatic supply needs to draw out the gas in the cylinder 502, so that the gas is discharged to the pneumatic supply through the gas inlet/outlet port 502.

Alternatively, in the case where the position of the gas inlet/outlet port 505 is located below the piston 503 (position C' as shown in FIG. 4b), if the piston 503 needs to move upward to urge the pneumatic bar 501 upward so that the suction cup 504 contacts the second protective film 402 of the double-sided adhesive 40, the pneumatic supply needs to supply gas to the cylinder 502.

Moreover, in an instance that the side wall of the cylinder 502 is provided with one gas inlet/outlet port 505 at the positions C and C' as shown in FIG. 4b, respectively, the pneumatic supply could supply gas to one of the gas inlet/outlet ports 505, and discharge the gas in the cylinder 502 through the other one of the gas inlet/outlet ports 505. The inflow and outflow directions of the gas and the moving direction of the pneumatic bar 501 are the same as described above, no description is repeated herein.

Based on this, next, the pneumatic supply discharges the gas between the suction cup 504 and the second protective film 402 through the gas passage 506 as shown in FIG. 4b, so that the suction cup 504 is adsorbed onto the second protective film 402.

Moreover, in an instance that the positioning structure 201 includes a lift device 50 and a pneumatic supply, releasing the securing of the adhesive layer 404 and the second protective film 402 by the positioning structure 201 includes:

Firstly, the pneumatic supply inflates the space between the suction cup 504 and the second protective film 402 of the double-sided adhesive 40 through the gas passage, so that the suction cup 504 disengages from the second protective film 402 of the double-sided adhesive 40, Based on this, next, the pneumatic supply acts on the cylinder 502 through the gas inlet/outlet port so that the pneumatic bar 501 moves in a direction away from the second protective film 402.

For example, in an instance that the side wall of the cylinder 502 is provided with one gas inlet/outlet port 505 and the position of the gas inlet/outlet port 505 changes, the gas acting on the pneumatic bar 201 will flow in and out in different directions. For example, in the case where the position of the gas inlet/outlet port 505 is located above the piston 503 (position C as shown in FIG. 4b), in an instance that the piston 503 needs to move downward (that is, to allow the pneumatic bar 501 to move in a direction away from the second protective film 402), the pneumatic supply needs to supply gas to the cylinder 502.

Alternatively, in the case where the position of the gas inlet/outlet port 505 is located below the piston 503 (position C' as shown in FIG. 4b), in an instance that the piston 503 needs to move downward, the pneumatic supply needs to discharge the gas in the cylinder 502.

Moreover, in an instance that the side wall of the cylinder 502 is provided with one gas inlet/outlet port 505 at the positions C and C' as shown in FIG. 4b, respectively, the pneumatic supply could supply gas to one of the gas inlet/outlet ports 505, and discharge the gas in the cylinder 502 through the other one of the gas inlet/outlet ports 505. The inflow and outflow directions of the gas and the moving direction of the pneumatic bar 501 are the same as described above, no description is repeated here.

In the process of attaching the entire double-sided adhesive, the robot arm is used to lift up or down the double-sided adhesive and the printed circuit board while stripping off the first protective film of the double-sided adhesive in the lifting process, and to press the printed circuit board onto the double-sided adhesive with the first protective film having been stripped off. The positioning structure can secure the second protective film and the adhesive layer of the double-sided adhesive in the process of stripping off the first protective film by the robot arm, to prevent the robot arm from taking off the double-sided adhesive directly from the preset position in the process of stripping off the protective film. Moreover, the positioning structure can also release the securing of the adhesive layer and the second protective film if the robot arm is required to unload the printed circuit board attached with the double-sided adhesive from the platform. No manual operation is needed in the attaching process and thus the attaching efficiency can be improved. Moreover, due to the control of the driver, the robot arm can attach the double-sided adhesive in higher alignment accuracy than the manual operation.

The described above are only exemplary embodiments and implementations of the present disclosure, and the present disclosure is not intended to limited thereto. For one of ordinary skill in the art, various modifications and improvements may be made without departing from the spirit and scope of embodiments of the present disclosure, and all of these modifications and improvements shall fall within the scope of the present invention.

The present application claims benefits of and priority to the Chinese patent application No.201510591922.9, entitled "double-sided adhesive attaching device and method for attachment of the double-sided adhesive" filed on Sep. 16, 2015, the entire disclosure of which is incorporated herein by reference.

What is claimed is:

1. A device for attaching double-sided adhesive onto a printed circuit board,
    wherein the double-sided adhesive comprises an adhesive layer, a first protective film and a second protective film located respectively at two sides of the adhesive layer; the double-sided adhesive attaching device comprises a driver, a platform and a robot arm provided above the platform;
    wherein the robot arm is connected with the driver and configured to, under the driving of the driver, place the double-sided adhesive onto a preset position of the platform, strip off the first protective film of the double-sided adhesive at the preset position, press the printed circuit board against the double-sided adhesive with the first protective film having been stripped off, and unload the printed circuit board attached with the double-sided adhesive from the preset position;
    wherein the preset position is provided with a positioning structure, which is configured to secure the adhesive layer and the second protective film when the robot arm is stripping off the first protective film, and to release the securing of the adhesive layer and the second protective film when the double-sided adhesive is attached to the printed circuit board; and
    wherein the platform is connected with the driver to allow the platform to rotate under the driving of the driver;
    the robot arm comprises an arm for the double-sided adhesive and an arm for the circuit board; the preset position comprises a first position and a second position;
    the arm for the double-sided adhesive is located at the first position to allow double-sided adhesive to be placed on the positioning structure, and the first protective film of the double-sided adhesive to be stripped off so as to expose a first adhesive surface when the platform rotates a positioning structure to the first position; and
    the arm for the circuit board is located at the second position to allow the printed circuit board to be pressed onto the first adhesive surface of the double-sided adhesive at the second position, and the printed circuit board attached with the double-sided adhesive to be unloaded from the second position when the platform rotates the double-sided adhesive at the first position to the second position.

2. A device for attaching double-sided adhesive onto a printed circuit board, wherein the double-sided adhesive comprises an adhesive layer, a first protective film and a second protective film located respectively at two sides of the adhesive layer; the double-sided adhesive attaching device comprises a driver, a platform and a robot arm provided above the platform; wherein the robot arm is connected with the driver and configured to, under the driving of the driver, place the double-sided adhesive onto a preset position of the platform, strip off the first protective film of the double-sided adhesive at the preset position, press the printed circuit board against the double-sided adhesive with the first protective film having been stripped off, and unload the printed circuit board attached with the double-sided adhesive from the preset position; wherein the preset position is provided with a positioning structure, which is configured to secure the adhesive layer and the second protective film when the robot arm is stripping off the first protective film, and to release the securing of the adhesive layer and the second protective film when the double-sided adhesive is attached to the printed circuit board; and wherein the platform is connected with the driver to allow the platform to rotate under the driving of the driver;
    wherein the robot arm comprises a first arm for the double-sided adhesive, a second arm for the double-sided adhesive, a first arm for the circuit board, a second arm for the circuit board; the preset position comprises a first position, a second position, a third position and a fourth position;
    the first arm for the double-sided adhesive is located at the first position to allow double-sided adhesive to be placed on the positioning structure when the platform rotates a positioning structure to the first position;

the second arm for the double-sided adhesive is located at the second position to allow the first protective film of the double-sided adhesive at the second position to be stripped off so as to expose a first adhesive surface when the platform rotates the double-sided adhesive at the first position to the second position;

the first arm for the circuit board is located at the third position to allow the printed circuit board to be pressed onto the first adhesive surface of the double-sided adhesive at the third position when the platform rotates the double-sided adhesive at the second position to the third position; and the second arm for the circuit board is located at the fourth position to allow the printed circuit board attached with the double-sided adhesive to be unloaded from the fourth position when the platform rotates the double-sided adhesive at the third position to the fourth position.

3. The double-sided adhesive attaching device according to claim 1, wherein the positioning structure comprises a restricting groove provided at the platform, the restricting groove has a depth greater than thickness of the double-sided adhesive.

4. The double-sided adhesive attaching device according to claim 3, wherein the positioning structure further comprises two pins fixed to a bottom surface of the restricting groove, and the pins are configured to pass through holes at two ends of the double-sided adhesive, respectively.

5. The double-sided adhesive attaching device according to claim 3, wherein the positioning structure further comprises at least one lift device located inside of the platform at a position corresponding to the restricting groove;

the lift device comprises a pneumatic bar and a cylinder, one end of the pneumatic bar being equipped with a piston located inside of the cylinder, and the other end of the pneumatic bar being equipped with a suction cup; and a bottom surface of the restricting groove is provided with a through-hole at a position corresponding to the pneumatic bar, the through-hole being configured in such a way that the pneumatic bar, when passing through the through-hole, brings the suction cup into contact with the double-sided adhesive in the restricting groove.

6. The double-sided adhesive attaching device according to claim 5, wherein the positioning structure further comprises a pneumatic supply;

the pneumatic bar is provided with a gas passage, one end of the gas passage communicates with a bottom of the suction cup, and the other end of the gas passage is connected with the pneumatic supply so as to receive gas provided by the pneumatic supply or to discharge the gas in the gas passage to the pneumatic supply; and the cylinder is provided with a gas inlet/outlet port at its side wall, and the gas inlet/outlet port communicates with the pneumatic supply to receive the gas provided by the pneumatic supply or to discharge the gas in the cylinder to the pneumatic supply.

7. The double-sided adhesive attaching device according to claim 2, wherein the positioning structure comprises a restricting groove provided at the platform, the restricting groove has a depth greater than thickness of the double-sided adhesive.

8. The double-sided adhesive attaching device according to claim 7, wherein the positioning structure further comprises two pins fixed to a bottom surface of the restricting groove, and the pins are configured to pass through holes at two ends of the double-sided adhesive, respectively.

9. The double-sided adhesive attaching device according to claim 4, wherein the positioning structure further comprises at least one lift device located inside of the platform at a position corresponding to the restricting groove;

the lift device comprises a pneumatic bar and a cylinder, one end of the pneumatic bar being equipped with a piston located inside of the cylinder, and the other end of the pneumatic bar being equipped with a suction cup; and the bottom surface of the restricting groove is provided with a through-hole at a position corresponding to the pneumatic bar, the through-hole being configured in such a way that the pneumatic bar, when passing through the through-hole, brings the suction cup into contact with the double-sided adhesive in the restricting groove.

10. The double-sided adhesive attaching device according to claim 8, wherein the positioning structure further comprises at least one lift device located inside of the platform at a position corresponding to the restricting groove;

the lift device comprises a pneumatic bar and a cylinder, one end of the pneumatic bar being equipped with a piston located inside of the cylinder, and the other end of the pneumatic bar being equipped with a suction cup; and the bottom surface of the restricting groove is provided with a through-hole at a position corresponding to the pneumatic bar, the through-hole being configured in such a way that the pneumatic bar, when passing through the through-hole, brings the suction cup into contact with the double-sided adhesive in the restricting groove.

11. A method for attachment of the double-sided adhesive by utilizing the double-sided adhesive attaching device of claim 2, comprising:

rotating the platform to rotate the positioning structure to the first position;

placing the double-sided adhesive onto the positioning structure by utilizing the arm for the double-sided adhesive located at the first position;

securing the adhesive layer and the second protective film of the double-sided adhesive by utilizing the positioning structure;

stripping off the first protective film of the double-sided adhesive so as to expose the first adhesive surface by utilizing the arm for the double-sided adhesive located at the first position;

rotating the platform to rotate the double-sided adhesive at the first position to the second position;

pressing the printed circuit board onto the first adhesive surface of the double-sided adhesive at the second position by utilizing the arm for the circuit board at the second position;

releasing the securing of the adhesive layer and the second protective film by utilizing the positioning structure; and unloading the printed circuit board attached with the double-sided adhesive from the second position by utilizing the arm for the circuit board at the second position.

12. A method for attachment of the double-sided adhesive by utilizing the double-sided adhesive attaching device of claim 1, comprising:

rotating the platform to rotate the positioning structure to the first position;

placing the double-sided adhesive onto the positioning structure by utilizing the first arm for the double-sided adhesive;

rotating the platform to rotate the double-sided adhesive at the first position to the second position;

securing the adhesive layer and the second protective film of the double-sided adhesive by utilizing the positioning structure;

stripping off the first protective film of the double-sided adhesive at the second position, to expose the first adhesive surface by utilizing the second arm for the double-sided adhesive;

rotating the platform to rotate the double-sided adhesive at the second position to the third position;

pressing the printed circuit board against the first adhesive surface of the double-sided adhesive at the third position by utilizing the first arm for the circuit board;

rotating the platform to rotate the double-sided adhesive at the third position to the fourth position;

releasing the securing of the adhesive layer and the second protective film by utilizing the positioning structure; and unloading the printed circuit board attached with the double-sided adhesive from the fourth position by utilizing the second arm for the circuit board.

13. The method for attachment of the double-sided adhesive according to claim 11, wherein under a condition of the positioning structure comprising a lift device and a pneumatic supply, the securing provided by the positioning structure against the adhesive layer and the second protective film, comprising:

the pneumatic supply acts on a cylinder through a gas inlet/outlet port so that a pneumatic bar moves in a direction toward the second protective film of the double-sided adhesive, a suction cup contacts the second protective film of the double-sided adhesive; the pneumatic supply discharges the gas between the suction cup and the second protective film through a gas passage, so that the suction cup is adsorbed to the second protective film.

14. The method for attachment of the double-sided adhesive according to claim 11, wherein under a condition of the positioning structure comprising a lift device and a pneumatic supply, releasing the securing of the adhesive layer and the second protective film by the positioning structure comprises:

the pneumatic supply inflates a space between a suction cup and the second protective film through a gas passage, so that the suction cup disengages from the second protective film of the double-sided adhesive; and the pneumatic supply acts on a cylinder through a gas inlet/outlet port so that a pneumatic bar moves in a direction away from the second protective film.

* * * * *